United States Patent [19]
Rittmann

[11] 4,169,982
[45] Oct. 2, 1979

[54] TOUCH-ACTUATED ELECTRONIC SWITCH

[76] Inventor: Albert D. Rittmann, 1111 Highland Dr., Kokomo, Ind. 46901

[21] Appl. No.: 858,535

[22] Filed: Dec. 8, 1977

[51] Int. Cl.² .................. H01H 35/00; H03K 13/00
[52] U.S. Cl. .................................. 307/116; 361/181; 307/308
[58] Field of Search .............. 307/116; 361/179, 181

[56] References Cited
U.S. PATENT DOCUMENTS 3,862,432  1/1975  Larson .............................. 307/116

Primary Examiner—L. T. Hix
Assistant Examiner—S. D. Schreyer

[57] ABSTRACT

A touch-actuated electronic switch is disclosed including a direct current or voltage supply having its output or common terminal connected to a voltage source which is alternating with respect to Earth ground, two signal inputs, at least one touch surface, means for connecting the touch surface to one of the signal inputs, an amplifying device and a network for imposing part of the signal found on the signal inputs onto the amplifying device. A mode of operation is disclosed wherein the amplifying device is allowed to float up and down in voltage to follow in part the alternating voltage of the signal inputs. The above arrangement can be used, through the addition of additional circuitry, to switch the power to a load on and off any time the touch surface is first touched.

2 Claims, 1 Drawing Figure

TOUCH-ACTUATED ELECTRONIC SWITCH

BACKGROUND

The present invention relates to touch-actuated electronic switches. A touch-actuated electronic switch which operates upon the mere touch of an operator can, because of the elimination of moving parts, be expected to be more reliable than a mechanical switch.

It is desired that such a touch-actuated electronic switch be highly immune to false triggering, be simple in construction, not require a sensitivity adjustment by the user, and operate with input current below that dangerous to humans. The present invention provides a touch-actuated electronic switch having these and other advantages.

SUMMARY

There exists a first form of touch-actuated electronic switch which incorporates an oscillator which changes in frequency or amplitude when someone touches the touch surface. This form of touch-actuated electronic switch suffers from various problems having to do with oscillator stability and sensitivity.

There exists a second form of touch-actuated electronic switch comprised of a touch surface, a sensing circuit and a wire running from the touch surface to the sensing circuit. When the wire is short and someone touches the touch surface the sensing circuit sees an AC pickup and counts this as a touch.

When the wire is long the sensing circuit always sees an AC pickup which is due to the wire itself. In order that the sensing circuit not count this AC pickup from the wire as a touch a manual or automatic sensitivity control can be employed so that only the increased AC pickup caused when someone touches the touch surface will cause the sensing circuit to respond.

In spite of the manual or automatic sensitivity control this second form of touch-actuated electronic switch suffers from false triggering. When the wire from the touch surface to the sensing circuit is long and when the AC power source in the area of the sensing circuit abruptly increases in voltage there will be a rapid increase in the AC pickup which will be intrepreted by the sensing circuit as if someone touched the touch surface. A false trigger will therefore occur.

In the interest of eliminating this false triggering due to AC voltage variations a third form of touch-actuated electronic switch exists which incorporates two wires from the sensing circuit to the touch surface, only one of the wires being connected to the touch surface. If the two wires run along similar paths then the AC pickup by both wires will be approximately the same. The sensing circuit compares the AC pickup of the two wires. When someone touches the touch surface the signal on the two wires becomes unequal and the sensing circuit responds appropriately.

If this third form of touch-actuated electronic switch is operated in the mode where the internal electrical ground of the sensing circuit is connected to Earth ground or is allowed to float with respect to Earth ground then the sensitivity of the sensing circuit will have to be made very high since the only signal pickup by the wires will be due to the electrical fields produced by the presence of nearby electrical wiring or equipment. This very high sensitivity leads to false triggering. Furthermore, when the wires are long, provisions must be made from an external AC power source coupled by impedances to the two wires to balance out the AC signal picked up by the long wires so that the voltage of the two wires does not go outside of the voltage operating range of the sensing circuit itself.

The present invention concerns the use of the two wires similar to those used in the third form of touch-actuated electronic switch but differing in the mode of operation and in the circuitry. The present invention first differs in that the internal electrical ground of the sensing circuit is made to follow the AC energized line or another AC voltage source. When this is done the capacitive or resistive impedance between each wire and Earth ground produces a rather strong AC signal in the input of the sensing circuit. When someone touches the touch surface the signal on the wire connected to the touch surface increases due to the increased capacitive or resistive coupling to Earth ground provided by the body of the toucher and the signal on the two wires is then unequal.

While this mode of operation allows a strong signal and does not require as much circuit amplification there is the danger in the case of long wires that the voltage of the two wires might go outside the voltage range of the sensing circuit. The voltage of the two wires could be held inside the voltage range of the sensing circuit if the strong signal could be balanced out by an impedance coupling to an AC voltage source which is 180° out of phase from the AC voltage of Earth ground as viewed from the internal circuit ground. This 180° out of phase AC voltage source would be expensive to provide and would not be likely to contain all of the irregularities including voltage spikes found in the typical AC power sources.

The present invention describes a fourth form of the touch-actuated electronic switch which is unique in that the sensing circuit which compares the signal on the two wires actually floats with respect to the internal electrical circuit ground in order to partially follow the voltage on the two wires. This eliminates the danger of having the voltage on the two wires go outside of the voltage range of the sensing circuit. This fourth form of touch-actuated electronic switch has the advantage of a high AC signal on the wires due to the mode of operation, high sensitivity to the user touching the touch surface, freedom from false triggering, the elimination of the need of a sensitivity adjustment control, the elimination of the need of a balancing network, simplicity in design, and a low manufacturing cost.

DESCRIPTION

Figure 1:
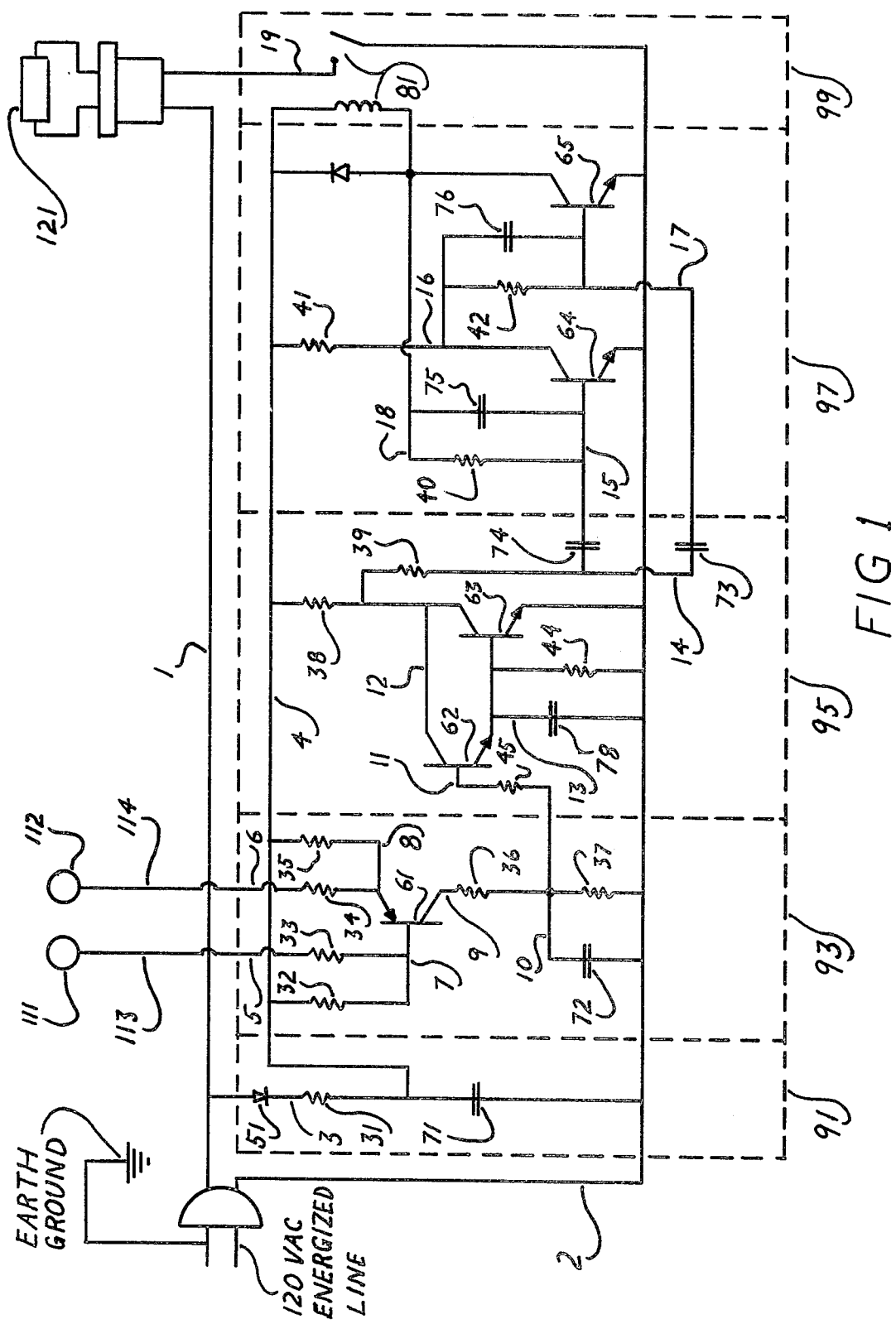
FIG. 1 shows a schematic representation of a touch-actuated electronic switch according to the present invention with various portions of the schematic enclosed within dashed lines to indicate major functional blocks.

In FIG. 1 the touch-actuated electronic switch of the present invention, is shown as including a power supply 91, touch surfaces 111 and 112, wires 113 and 114, a floating signal comparer 93, trigger circuit 95, a bistable multivibrator 97, and a power control 99.

With more particularity, power supply 91 includes a rectifying diode 51, a voltage dropping resistor 31, and a capacitor 71. The value of the resistor is chosen so that the B+ voltage at point 4 will be at a desired voltage above the internal circuit ground 2. A B+ of 30 volts has been used successfully and other values of voltage can also be used.

It should be noted that the energized AC line is connected to the internal circuit ground 2 thereby causing the internal circuit ground to follow the full 120 volts AC voltage swing.

The B+ point 4 also has an AC voltage swing of 120 volts although displaced by B+ volts.

In the present invention either or both touch surfaces 111 and 112 can be used. The touch surfaces are connected to the floating signal comparer 93 by means of wires 113 and 114. The wires 113 and 114 should be of similar length and for best results follow a close path between the touch surface (S) and the signal comparer. In the present invention wires 113 and 114 of lengths greater than 150 feet have been successfully used.

The amount of AC signal on the wires 113 (or 114), with respect to the B+, point 4, depends on the capacitive and/or resistive impedance between Earth ground and the combination of the wire 113 (or 114), the touch surface 111 (or 112), and the body of the toucher, should he be touching the touch surface. If both wires 113 and 114 are of approximately equivalent length and if they follow similar paths and if neither touch surface is being touched then the AC signal on both wires 113 and 114 will be almost identical. Even when there are irregularities in the AC line voltage, including transients, the voltage on wires 113 and 114 will be almost identical at any instant of time.

Wire 113 is connected to the base 7 of transistor 61 by means of resistor 33 and the base 7 of transistor 61 is further connected to point 4, B+, by means of resistor 32. Wire 114 is connected to the emitter 8 of transistor 61 by means of resistor 34 and the emitter 8 of transistor 61 is further connected to point 4, B+, by means of resistor 35.

Resistors 33 and 32 are acting as a potential divider and resistors 34 and 35 are similarly acting as a potential divider. It has been previously explained that when no one is touching either touch surface the AC signal on wires 113 and 114 are almost identical. It can be further stated that the instantanious voltage on wires 113 and 114 are essentially identical in the absence of a touch of the touch surface. If the values of resistors 32, 33, 34 and 35 are properly chosen then the instantanious voltage on the base 7 of transistor 61 will be almost identical to the instantanious voltage on the emitter 8 of transistor 61.

When neither touch surface is being touched transistor 61 will be biased off and will be in a nonconductive condition. The floating signal comparer 93 will recognize that no touch is being made.

When the touch surface 111 (or 112) is touched then the capacitive or resistive impedance between the toucher's body and Earth ground will increase the AC signal on the wire 113 (or 114) with respect to point 4, B+, and the AC signal on the two wires is no longer almost identical. Due to the previously explained potential dividing effect of resistors 32, 33, 34 and 35 the voltages on base 7 and emitter 8 of transistor 61 during the touch are not identical. During part of the AC signal transistor 61 is biased on and is in the conducting condition. This is true regardless of which touch surface is being touched.

The collector 9 of transistor 61 is connected to point 10 by means of resistor 36 and point 10 is further connected to the internal circuit ground 2 by the parallel combination of resistor 37 and capacitor 72. When a touch surface is being touched the resulting current through resistor 36 causes the voltage of point 10 to rise above internal circuit ground, whereas, when neither touch surface was being touched the voltage of point 10 was at internal circuit ground. The voltage of point 10 is used to activate the trigger circuit.

In understanding the functioning and nature of the floating signal comparer it should be recognized that most of the impedance coupling between the wires 113 and 114 and Earth ground is of a capacitive nature which is not capable of carrying direct current. For this reason the voltages on wires 113 and 114 alternate sinusoidally above and below the voltage of point 4, B+. Considering the potential dividing effects of resistors 32, 33, 34 and 35 the voltages of the base 7 and emitter 8 of transistor 61 actually go above and below the voltage of point 4, B+. Transistor 61 is truly floating out of the normal operating range of the circuitry. It would normally be expected that the voltage on the emitter of a transistor would lie between the voltages of the internal circuit ground and the B+ voltage. This is not the case in the floating signal comparer of this invention and the use of transistor 61 in this unusual mode of operation is truly unique.

Although the circuit shown in FIG. 1 shows resistors 32 and 35 connected to point 4, B+, the circuit would also function properly if resistors 32 and 35 were connected to some other voltage reference as long as that voltage is higher than the internal circuit ground.

Although the circuit shown employs a PNP transistor 61 in the floating signal comparer, an NPN transistor could also be used. In that case the resistors 32 and 35 would be connected to the internal circuit ground or to some other voltage reference as long as that voltage is lower than point 4, B+.

The important consideration is that the voltage of the emitter and base of the transistor in the floating signal comparer be allowed to float above and below the voltage of the point to which the resistors 32 and 35 are attached.

In practice resistors 33 and 34 were selected to have a value of 680 kilohms each. This resistance value insures on one hand that there is no danger of electric shock to the person touching the touch surface and on the other hand that the signal reaching the emitter 7 and base 8 of transistor 61 will not be lost through voltage drop across resistors 33 and 34. Resistors 32 and 35 wre selected to have a value of 330 kilohms each. Although the value of 680 kilohms is given for resistors 33 and 34 and 330 kilohms is given for resistors 32 and 35 the circuit will function with a wide range of values for these resistors.

As indicated above, the voltage of point 10 is at the internal circuit ground 2 when the touch surface is not being touched and is at a higher voltage when the touch surface is being touched.

When the voltage of point 10 rises, a current is supplied through resistor 45 to the base 11 of transistor 62 which is connected in the Darlington configuration with transistor 63. The result is that soon after the first instant of the touching of the touch surface point 12 is rapidly lowered toward the internal circuit ground. Point 12 is connected through resistor 39 to point 14 and point 14 is connected to the bistable multivibrator 97 by means of capacitors 73 and 74 in such a way that whenever the voltage of point 12 falls rapidly the bistable multivibrator switches.

In one condition of the bistable multivibrator the power control device 99, which is shown as a relay, is actuated. In the other condition of the bistable multivibrator the power control device 99 is deactuated.

When the power control device 99 is actuated the AC supply voltage is applied to the load 121.

The circuit of FIG. 1 has been found to reliably switch a load whenever a touch surface is first touched. It has high immunity to false triggering, does not require a sensitivity adjustment, is simple in construction, and operates with input current below that dangerous to humans.

While there has been described above a preferred embodiment incorporating the principles of this invention, it is to be recognized that other embodiments incorporating these principles will be apparent to those skilled in the art and will fall within the scope of the invention as claimed.

What is claimed is:

1. A touch-actuated electronic switch, comprising in combination: a direct current or voltage supply with output and common terminals; a voltage source alternating with respect to Earth ground; means for connecting said alternating voltage source to either the output or common terminal of the direct current or voltage supply such that the output terminal of the direct current or voltage supply has imposed on it all or part of the alternating voltage of said alternating voltage source; first signal input means; second signal input means; at least one touch surface; means for providing electrical connection between the touch surface and one of the input means; an amplifying device having at least three terminals, the relative voltage of the first terminal and the second terminal determining the voltage of or the current drawn by the third terminal; two or more resistors in series joining the first signal input means to a first voltage reference point, the common point of two of these resistors being connected to the first terminal of the amplifying device; two or more resistors in series joining a second signal input means to a second voltage reference point, the common point of two of these resistors being connected to the second terminal of the amplifying device; and third circuit means for controlling the power to a load or performing some other useful function depending on the voltage of or the current drawn by the third terminal of the amplifying device.

2. The touch-actuated electronic switch of claim 1 wherein the amplifying device is a transistor with the base being the first terminal of the amplifying device, the emitter being the second terminal of the amplifying device and the collector being the third terminal of the amplifying device.

* * * * *